(12) United States Patent
Yokouchi

(10) Patent No.: US 8,446,005 B2
(45) Date of Patent: May 21, 2013

(54) SEMICONDUCTOR DEVICE HAVING A BUS CONFIGURATION WHICH REDUCES ELECTROMIGRATION

(75) Inventor: Tomoharu Yokouchi, Osaka (JP)

(73) Assignee: Panasonic Corporation, Osaka (JP)

( * ) Notice: Subject to any disclaimer, the term of this patent is extended or adjusted under 35 U.S.C. 154(b) by 48 days.

(21) Appl. No.: 13/224,056

(22) Filed: Sep. 1, 2011

(65) Prior Publication Data

US 2012/0221759 A1 Aug. 30, 2012

(30) Foreign Application Priority Data

Feb. 28, 2011 (JP) .................................. 2011-042785

(51) Int. Cl.
*H01L 23/48* (2006.01)
(52) U.S. Cl.
USPC ........... 257/734; 257/690; 257/691; 257/784; 257/E21.476; 257/E23.02; 257/E23.033
(58) Field of Classification Search
USPC .................. 257/690, 691, 734, 784, E21.476, 257/E23.02, E23.033
See application file for complete search history.

(56) References Cited

U.S. PATENT DOCUMENTS

| | | | |
|---|---|---|---|
| 5,786,627 A | 7/1998 | Inoue et al. | |
| 6,346,728 B1 | 2/2002 | Inoue et al. | |
| 7,667,316 B2 * | 2/2010 | Fukamizu et al. | 257/691 |
| 7,687,900 B2 * | 3/2010 | Fukamizu et al. | 257/690 |
| 8,138,615 B2 * | 3/2012 | Fukamizu et al. | 257/784 |
| 2002/0011674 A1 | 1/2002 | Efland et al. | |
| 2008/0099783 A1 * | 5/2008 | Fukamizu et al. | 257/177 |
| 2008/0128755 A1 | 6/2008 | Fukamizu et al. | |
| 2008/0128826 A1 | 6/2008 | Fukamizu et al. | |
| 2008/0203577 A1 * | 8/2008 | Fukamizu et al. | 257/773 |

FOREIGN PATENT DOCUMENTS

| | | |
|---|---|---|
| JP | 2002-164437 | 6/2002 |
| JP | 2008-140970 | 6/2008 |

* cited by examiner

*Primary Examiner* — Andy Huynh
(74) *Attorney, Agent, or Firm* — McDermott Will & Emery LLP

(57) ABSTRACT

A semiconductor device includes: a first transistor; a second transistor; an interlayer insulating film covering the transistors; a rectangular-shaped first bus formed on the interlayer insulating film and connected to first source/drain regions; a rectangular-shaped second bus formed on the interlayer insulating film with spacing from the first bus and connected to third source/drain regions; an inter-bus interconnect formed between the first and second buses for connecting these buses; a first contact pad provided on the first bus, to which a wire is connected; and a second contact pad provided on the second bus, to which a wire is connected. The inter-bus interconnect is in contact with part of the side of the first bus facing the second bus and part of the side of the second bus facing the first bus. The first and second contact pads are respectively in contact with part of the first and second buses.

7 Claims, 9 Drawing Sheets

SEMICONDUCTOR DEVICE HAVING A BUS CONFIGURATION WHICH REDUCES ELECTROMIGRATION

CROSS-REFERENCE TO RELATED APPLICATION

This application claims priority to Japanese Patent Application No. 2011-042785 filed on Feb. 28, 2011, the disclosure of which including the specification, the drawings, and the claims is hereby incorporated by reference in its entirety.

BACKGROUND

The present disclosure relates to a semiconductor device, and more particularly to a power semiconductor device.

In recent years, with the spread of information technology, higher-speed and lower-power implementation for electronic apparatuses, such as computers, information storage devices, mobile phones, and portable cameras, has been in high demand. Among the components of these electronic apparatuses, key semiconductor electronic components such as power supplies, motor drivers, and audio amplifiers greatly affect the performance of the electronic apparatuses, and power semiconductor devices incorporating power devices greatly affect the performance of these semiconductor electronic components. Therefore, demands for higher speed and lower power for power semiconductor devices are especially high.

A power transistor constituting a power semiconductor device generally has a configuration of transistors called cells connected in parallel. In this configuration, the sources alone, and the drains alone, of the cells are individually connected to one another via interlayer interconnects called buses. The buses are connected to contact pads, which are then connected to external connection terminals such as leads via wires.

In supply of a current to the transistors from outside the semiconductor device, it is ideal that the current flows in a bus uniformly to permit uniform current supply to the cells. However, the bus has a slight resistance, and the influence of this resistance increases as the speed of the power semiconductor device becomes higher, resulting in that, while the current flows easily in some part of the bus, it does not flow easily in the other part thereof. This is likely to cause phenomena such as that the bus is damaged due to electromigration caused by current concentration and that the current concentrates in some cells causing damage, and this degrades the reliability.

To prevent occurrence of the above phenomena, it has been examined to connect a plurality of pads to a bus or divide a bus into a plurality of regions (see Japanese Patent Publication No. 2002-164437 and Japanese Patent Publication No. 2008-140970, for example).

SUMMARY

Power semiconductor devices often use a complementary MOS (CMOS) inverter circuit where the drain of an N-channel metal oxide semiconductor (MOS) transistor and the drain of a P-channel MOS transistor are connected to each other, a push-pull amplifier circuit where a source and a drain of two MOS transistors are mutually connected to each other, a differential amplifier circuit where the sources or drains of two MOS transistors are mutually connected to each other, etc. In the connection between a source and a drain of two power transistors or between the sources or drains thereof, it is preferable to place the two transistors side by side and form a common bus lying astride the two transistors. With this configuration, the two power transistors can be connected to each other with minimum space. However, since such a common bus lying astride the two transistors is larger than a normal bus, the non-uniformity of a current in the bus will become a larger problem than in the case of the normal bus. Moreover, since the current does not necessarily flow to the two transistors completely equally during operation, the current path in the bus will become more complicated, and thus the current concentration will become a larger problem.

Moreover, since the bus is made of a metal film, formation of a large bus lying astride two transistors will increase the stress applied to the bus itself and an interlayer insulating film, etc. underlying the bus. Therefore, there arise other problems that the bus is likely to rupture due to mechanical stress and that cracks are likely to occur in the interlayer insulating film.

It is an object of the present disclosure to provide a semiconductor device that has a configuration of two adjoining transistors connected to each other and can achieve a balance between space savings and prevention or reduction of degradation in reliability due to current concentration.

Specifically, an example semiconductor device includes: a first transistor formed on a substrate, having first source/drain regions and second source/drain regions; a second transistor formed on the substrate, having third source/drain regions and fourth source/drain regions; an interlayer insulating film formed on the substrate to cover the first transistor and the second transistor; a first bus in a rectangular shape in plan formed on the interlayer insulating film and connected to the first source/drain regions; a second bus in a rectangular shape in plan formed on the interlayer insulating film with spacing from the first bus and connected to the third source/drain regions; an inter-bus interconnect formed between the first bus and the second bus for connecting the first bus with the second bus; a first contact pad provided on the first bus, to which a wire is connected; and a second contact pad provided on the second bus, to which a wire is connected, wherein the inter-bus interconnect is in contact with part of a side of the first bus facing the second bus and part of a side of the second bus facing the first bus, the first contact pad is in contact with part of the first bus, and the second contact pad is in contact with part of the second bus.

The example semiconductor device has the inter-bus interconnect formed between the first bus and the second bus for connecting the first bus with the second bus, and the inter-bus interconnect is in contact with part of the side of the first bus facing the second bus and part of the side of the second bus facing the first bus. Therefore, the current path between the first bus and the second bus is restricted, whereby current concentration is not likely to occur in the first bus and the second bus, and thus damage of the buses due to electromigration is not likely to occur. Also, since it is unnecessary to form a large bus, mechanical stress is not likely to occur, and thus mechanical damage of the buses is not likely to occur.

DETAILED DESCRIPTION

Figure 1:
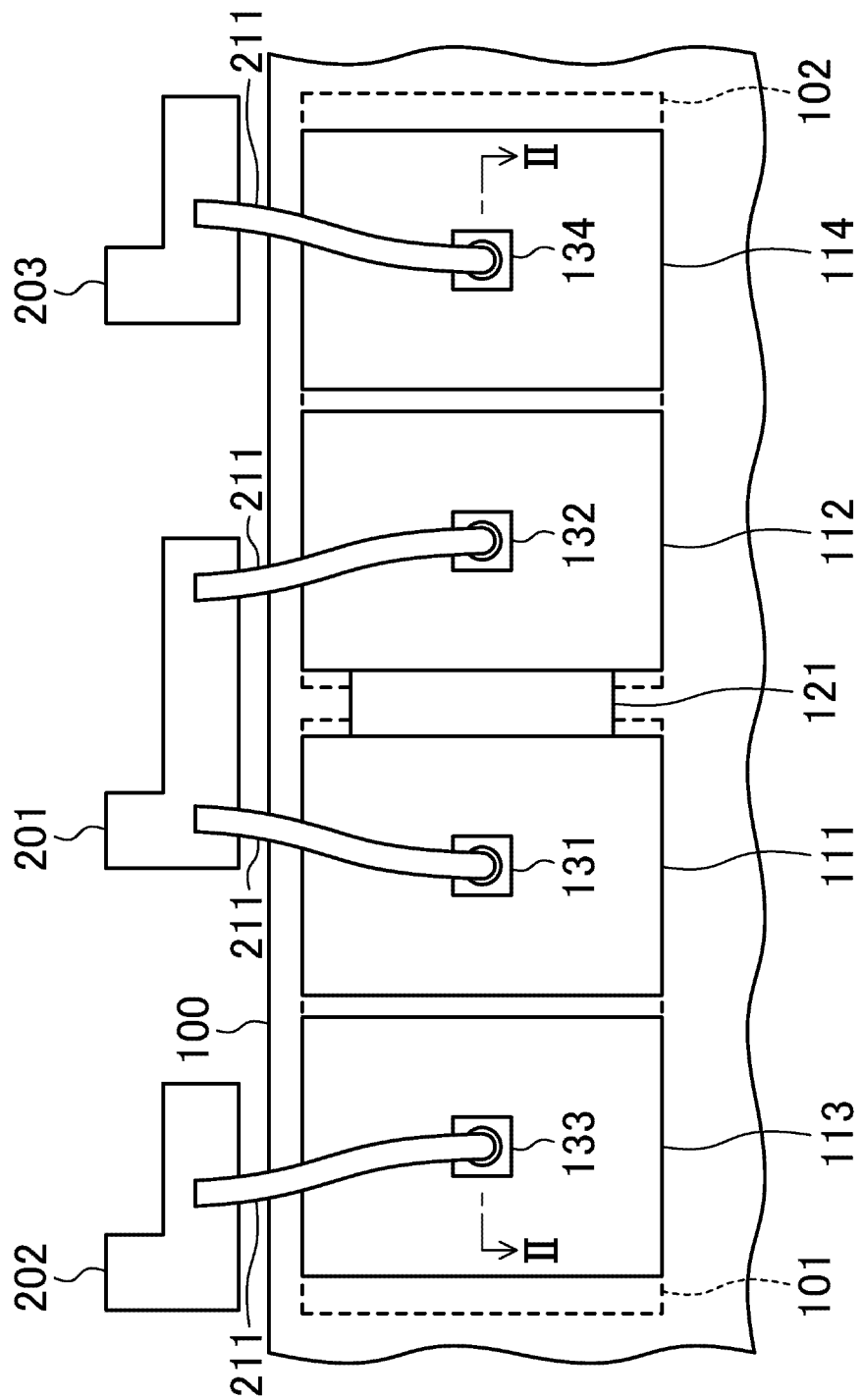
FIG. 1 is a plan view showing a semiconductor device of an embodiment.

As shown in FIG. 1, a semiconductor device of an embodiment includes a first bus 111 formed on a substrate of a semiconductor chip 100 via interlayer insulating films and a second bus 112 formed with spacing from the first bus 111. An inter-bus interconnect 121 is formed between the first bus 111 and the second bus 112 for connecting the first and second buses 111 and 112 to each other. The first and second buses 111 and 112, each being a metal layer in a rectangular shape in plan, are placed so that one side of one of the buses is opposed to one side of the other bus. The inter-bus interconnect 121 is in contact with the side of the first bus 111 facing the second bus 112 and the side of the second bus 112 facing the first bus 111. The length of the portion of the first bus 111 in contact with the inter-bus interconnect 121 is shorter than the length of the side of the first bus 111 facing the second bus 112, and the length of the portion of the second bus 112 in contact with the inter-bus interconnect 121 is shorter than the length of the side of the second bus 112 facing the first bus 111. In FIG. 1, the inter-bus interconnect 121 is in contact with center portions of the first bus 111 and the second bus 112, and not with both end portions of the first and second buses 111 and 112.

A third bus 113 is formed on the side of the first bus 111 opposite to the side thereof facing the second bus 112. A fourth bus 114 is formed on the side of the second bus 112 opposite to the side thereof facing the first bus 111. A first contact pad 131, a second contact pad 132, a third contact pad 133, and a fourth contact pad 134, to which wires are bonded, are respectively formed on the first bus 111, the second bus 112, the third bus 113, and the fourth bus 114. The first contact pad 131 and the second contact pad 132 are connected to a first inner lead 201 via wires 211. The third contact pad 133 is connected to a second inner lead 202 via a wire 211, and the fourth contact pad 134 is connected to a third inner lead 203 via a wire 211.

A first transistor 101 is formed in a region of the substrate under the first bus 111 and the third bus 113, and a second transistor 102 is formed in a region thereof under the second bus 112 and the fourth bus 114. The first transistor 101 has first source/drain regions and second source/drain regions: the first bus 111 is connected to the first source/drain regions while the third bus 113 is connected to the second source/drain regions. The second transistor 102 has third source/drain regions and fourth source/drain regions: the second bus 112 is connected to the third source/drain regions while the fourth bus 114 is connected to the fourth source/drain regions. Note that, when either the first or second source/drain regions are source regions of the first transistor 101, the other are drain regions thereof. Likewise, when either the third or fourth source/drain regions are source regions of the second transistor 102, the other are drain regions thereof.

Figure 2:
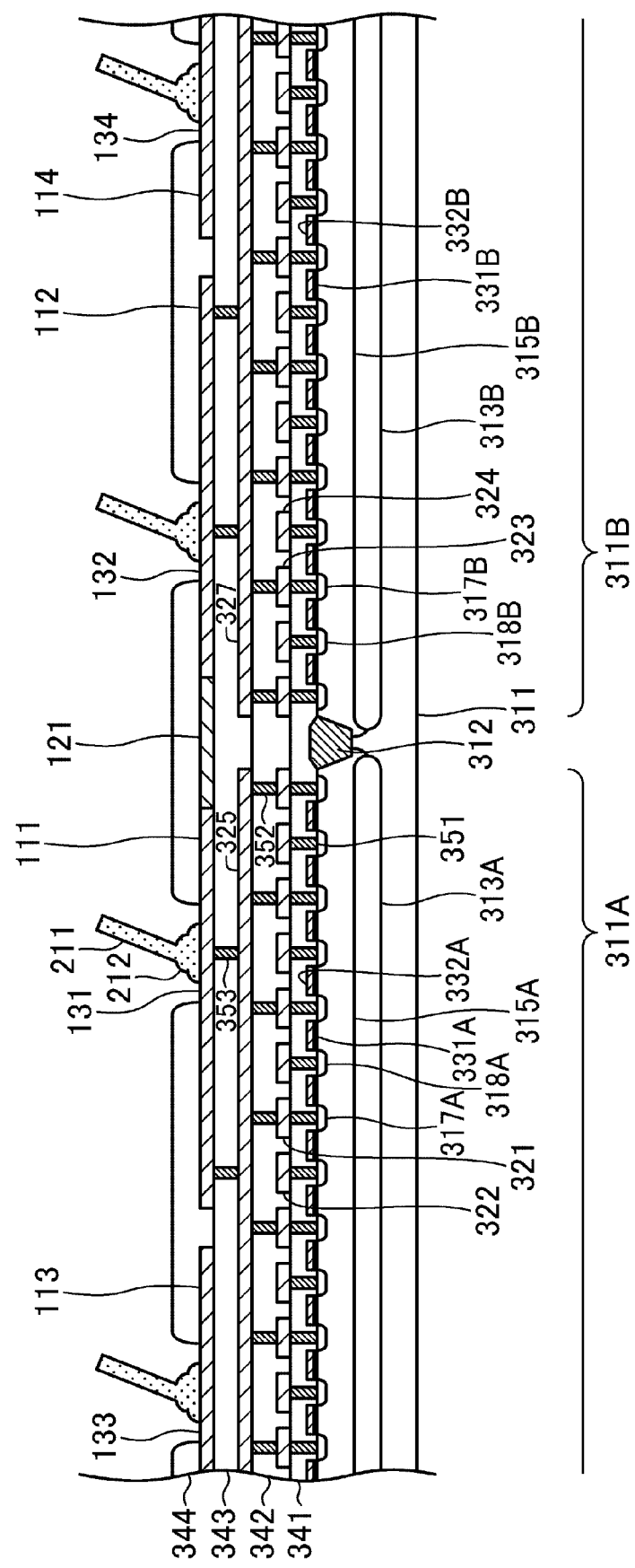
FIG. 2 is a cross-sectional view taken along line II-II in FIG. 1.

A specific configuration of the first transistor 101 and the second transistor 102 will be described with reference to FIG. 2. FIG. 2 shows a cross-sectional configuration along line II-II in FIG. 1. As shown in FIG. 2, the first transistor 101 comprised of a plurality of first cells is formed in a first region 311A of a substrate 311 made of p-type silicon, and the second transistor 102 comprised of a plurality of second cells is formed in a second region 311B isolated from the first region 311A by an element isolation region 312.

In the first region 311A, formed are a first buried region 313A, a first well region 315A, first source/drain regions 317A, second source/drain regions 318A, first gate insulating films 331A, and first gate electrodes 332A. In the second region 311B, formed are a second buried region 313B, a second well region 315B, third source/drain regions 317B, fourth source/drain regions 318B, second gate insulating films 331B, and second gate electrodes 332B. The first and second gate electrodes 332A and 332B are polysilicon gates, for example. The first and second source/drain regions 317A and 318A are impurity-diffused layers having a conductivity type opposite to that of the first well region 315A, and the third and fourth source/drain regions 317B and 318B are impurity-diffused layers having a conductivity type opposite to that of the second well region 315B. One first gate electrode 332A, one first source/drain region 317A, and one second source/drain region 318A constitute one first cell, and one second gate electrode 332B, one third source/drain region 317B, and one fourth source/drain region 318B constitute one second cell.

A first interlayer insulating film 341 is formed on the substrate 311 to cover the first gate electrodes 332A and the second gate electrodes 332B. On the first interlayer insulating film 341, formed are first lower source/drain lines 321, second lower source/drain lines 322, third lower source/drain lines 323, and fourth lower source/drain lines 324. The first, second, third, and fourth lower source/drain lines 321-324 are made of a metal layer. The first and second lower source/drain lines 321 and 322 are respectively connected to the first and second source/drain regions 317A and 318A via contacts 351. The third and fourth lower source/drain lines 323 and 324 are respectively connected to the third and fourth source/drain regions 317B and 318B via contacts 351.

A second interlayer insulating film 342 is formed on the first interlayer insulating film 341 to cover the first to fourth lower source/drain lines 321-324. In the first region 311A, first upper source/drain lines 325 made of a metal layer are formed on the second interlayer insulating film 342, and connected to the first lower source/drain lines 321 via vias 352. In the second region 311B, third upper source/drain lines 327 made of a metal layer are formed on the second interlayer insulating film 342, and connected to the third lower source/drain lines 323 via vias 352.

Figure 3:
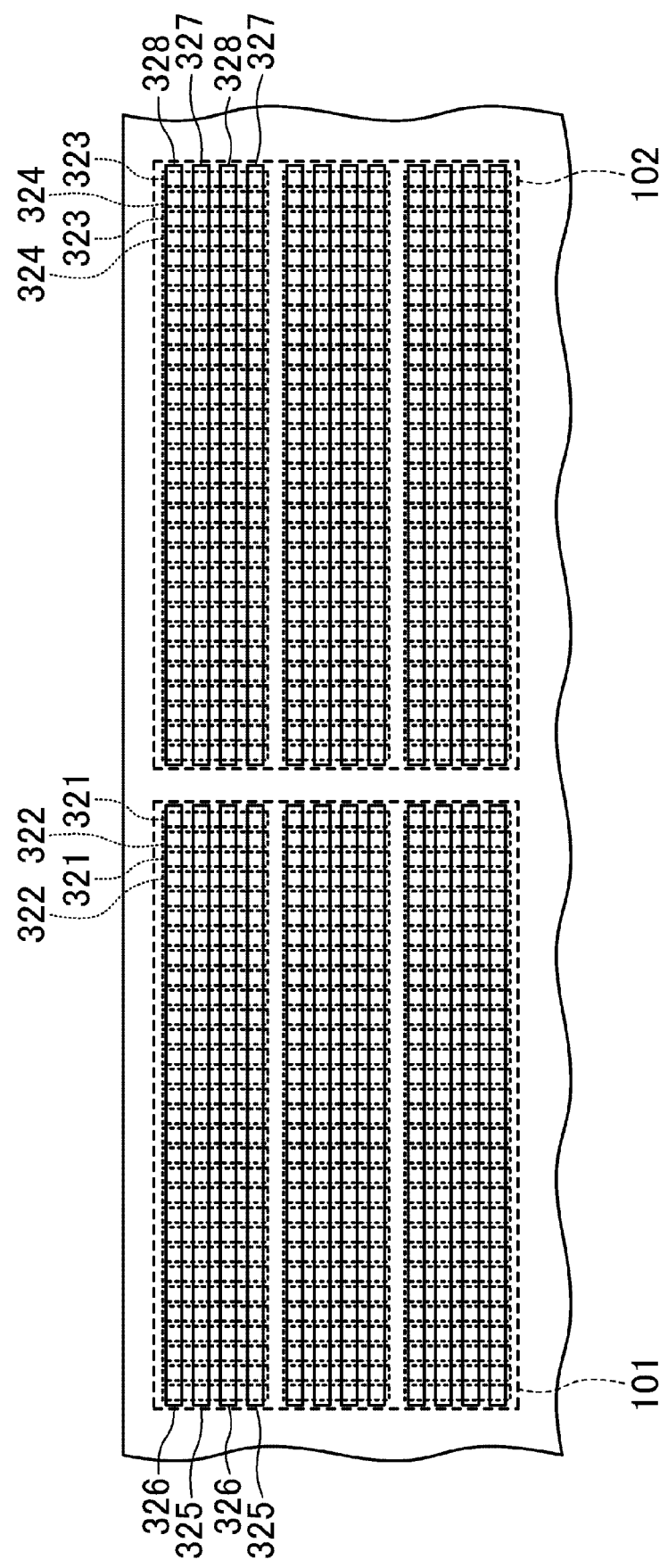
FIG. 3 is a plan view showing arrangement of source/drain lines in the semiconductor device of the embodiment.

FIG. 3 shows a planar configuration of a region in which the first transistor 101 and the second transistor 102 are formed, where only layers lying under the layer of the first to fourth buses 111-114 are shown. As shown in FIG. 3, a plurality of first upper source/drain lines 325 extend in the direction orthogonal to the first and second lower source/drain lines 321 and 322. Second upper source/drain lines 326 each extend between the adjacent first upper source/drain lines 325, and are connected to the second lower source/drain lines 322 via vias 352. A plurality of third upper source/drain lines 327 extend in the direction orthogonal to the third and fourth lower source/drain lines 323 and 324. Fourth upper source/drain lines 328 each extend between the adjacent third upper source/drain lines 327, and are connected to the fourth lower source/drain lines 324 via vias 352.

A third interlayer insulating film 343 is formed on the second interlayer insulating film 342 to cover the first to fourth upper source/drain lines 325-328. On the third interlayer insulating film 343, formed are the first bus 111, the second bus 112, the third bus 113, and the fourth bus 114 that are metal layers. The first bus 111 is connected to the first upper source/drain lines 325 via vias 353, and the third bus 113 is connected to the second upper source/drain lines 326 via vias 353. The second bus 112 is connected to the third upper source/drain lines 327 via vias 353, and the fourth bus 114 is connected to the fourth upper source/drain lines 328 via vias 353. The inter-bus interconnect 121 that is a metal layer connected with the first bus 111 and the second bus 112 is formed between the first and second buses 111 and 112.

A fourth interlayer insulating film 344 is formed on the third interlayer insulating film 343 to cover the first to fourth buses 111-114 and the inter-bus interconnect 121. Openings are formed through the fourth interlayer insulating film 344. A portion of the first bus 111 exposed through the corresponding opening is defined as the first contact pad 131, a portion of the second bus 112 exposed through the corresponding opening is defined as the second contact pad 132, a portion of the third bus 113 exposed through the corresponding opening is defined as the third contact pad 133, and a portion of the fourth bus 114 exposed through the corresponding opening is defined as the fourth contact pad 134. The wires 211 are connected to the first to fourth contact pads 131-134 with balls 212 interposed therebetween.

The first source/drain regions 317A are connected in parallel with one another via the first lower source/drain lines 321, the first upper source/drain lines 325, and the first bus 111, and the second source/drain regions 318A are connected in parallel with one another via the second lower source/drain lines 322, the second upper source/drain lines 326, and the third bus 113. The third source/drain regions 317B are connected in parallel with one another via the third lower source/drain lines 323, the third upper source/drain lines 327, and the second bus 112, and the fourth source/drain regions 318B are connected in parallel with one another via the fourth lower source/drain lines 324, the fourth upper source/drain lines 328, and the fourth bus 114. Although not shown, the first gate electrodes 332A are connected in parallel with one another, and the second gate electrodes 332B are connected in parallel with one another.

In the semiconductor device of this embodiment, the lower source/drain lines, the upper source/drain lines, and the buses, which are metal layers, are formed between the first region 311A of the substrate 311, where the first transistor 101 is formed, and the first and third contact pads 131 and 133. Also, a plurality of vias are formed between these metal layers. Moreover, the lower source/drain lines and the upper source/drain lines extend in directions orthogonal to each other. Therefore, right under the first and third contact pads 131 and 133, with the interlayer insulating films being reinforced with these metal layers and vias, it is possible to prevent or reduce occurrence of damage to the first transistor 101 due to shock at bonding of the wires and shock at testing with a probe. This also applies to the second transistor 102.

The current path of the semiconductor device of this embodiment will be described hereinafter. The current supplied via the wire 211 connected to the first contact pad 131 propagates in the first bus 111 and flows to the first upper source/drain lines 325 via the vias 353. The current further flows from the first upper source/drain lines 325 to the first lower source/drain lines 321 via the vias 352, and then to the first source/drain regions 317A via the contacts 351. The current also flows to the second bus 112 via the inter-bus interconnect 121. The current that has flown to the second bus 112 flows through the via 353 connected to the second bus 112, the third upper source/drain lines 327, the vias 352, the third lower source/drain lines 323, and the contacts 351 to the third source/drain regions 317B of the second transistor 102.

When the first transistor 101 is inactive while the second transistor 102 is active in switching operation, etc., the current exclusively flows to the third source/drain regions 317B. At this time, it is ideal that the current flows from the first contact pad 131 to the second bus 112 uniformly. However, if a large common bus as an integrated bus of the first and second buses 111 and 112 is formed, the current won't flow from the first contact pad 131 formed on the first-transistor portion of the common bus to the second-transistor portion thereof uniformly, causing current concentration.

To avoid occurrence of current concentration between the first bus 111 and the second bus 112, a configuration may be used where the first bus 111 and the second bus 112 are connected to each other only via the first inner lead 201, without provision of the inter-bus interconnect 121. However, this configuration is not preferable because the resistances of the first source/drain regions 317A and the third source/drain regions 317B will become large.

By contrast, in the semiconductor device of this embodiment, the first bus 111 and the second bus 112 that are independent from each other are connected via the inter-bus interconnect 121 smaller in width than the first and second buses 111 and 112. Therefore, the current path from the first contact pad 131 to the second bus 112 is restricted by the inter-bus interconnect 121, thereby facilitating uniform flow of the current to the second bus 112. When the second transistor 102 is inactive while the first transistor 101 is active, conversely, uniform flow of the current from the second contact pad 132 to the first bus 111 is facilitated. Flows of currents can also be made uniform when both the first transistor 101 and the second transistor 102 are active.

Also, it is only necessary to form a metal layer having a size about a half of that required when the first and second buses 111 and 112 are formed integrally. Therefore, the stress applied to the metal layer and the stress applied from the metal layer to the interlayer insulating films can be reduced, providing an advantage that rupture, etc. of the metal layer due to mechanical stress is less likely to occur. Also, since the area of the metal layer can be small, corrosion resistance improves, and moreover resistance to electrostatic discharge improves.

In the semiconductor device of this embodiment, which can avoid current concentration between the first bus 111 and the second bus 112, it is unnecessary to connect a plurality of wires 211 to the first and second buses 111 and 112. Therefore, the degree of freedom of layout of the buses and the contact pads improves. Also, the degree of freedom of design of the lead frame improves.

Figure 4:
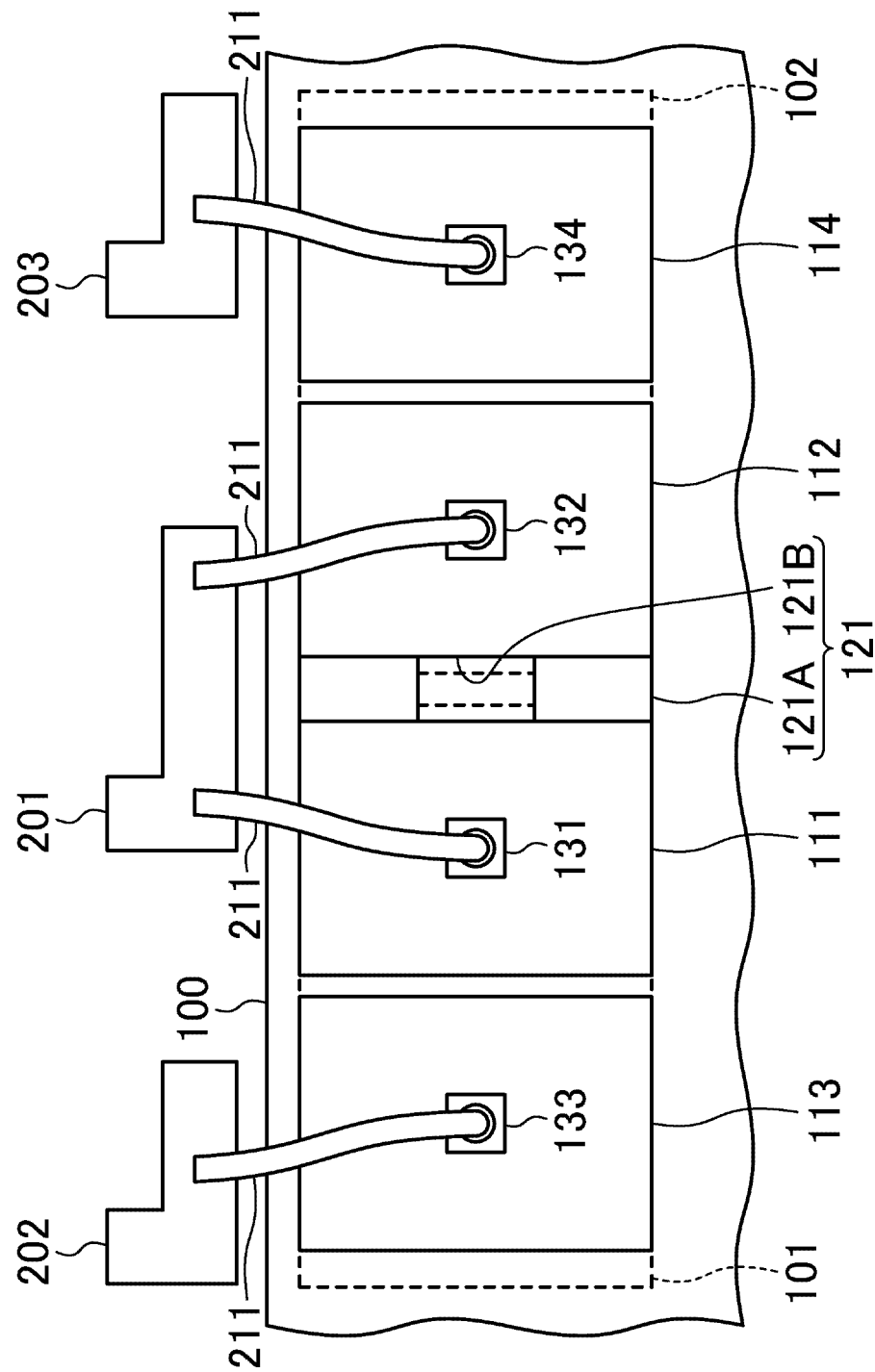
FIG. 4 is a plan view showing a variation of the semiconductor device of the embodiment.

In this embodiment, the inter-bus interconnect 121 is smaller in width than the first and second buses 111 and 112, and is not in contact with both end portions of the first and second buses 111 and 112. However, the inter-bus interconnect may have any shape if only it can restrict the path of the current flowing from the first bus 111 to the second bus 112 and the current flowing from the second bus 112 to the first bus 111 properly. For example, as shown in FIG. 4, the inter-bus interconnect may be formed of a plurality of conductors 121A, and an opening 121B allowing no contact between the first and second buses 111 and 112 may be formed between the conductors 121A. In this case, the current dispersion effect can be further enhanced by placing the opening 121B on the straight line connecting the first contact pad 131 with the second contact pad 132.

Although the inter-bus interconnect 121 has two conductors 121A in FIG. 4, it may have three or more divided conductors 121A. Also, although the distance from the first inner lead 201 to the first contact pad 131 is equal to the distance from the first inner lead 201 to the second contact pad 132 in FIGS. 1 and 4, it is unnecessary to align the position of the first contact pad 131 with the position of the second contact pad 132. For example, the position of the first contact pad 131 may be displaced from the position of the second contact pad 132, forming the first contact pad 131 at a position closer to the first inner lead 201 while forming the second contact pad 132 at a position farther from the first inner lead 201. With this configuration, the current can be dispersed further effectively.

Figure 5:
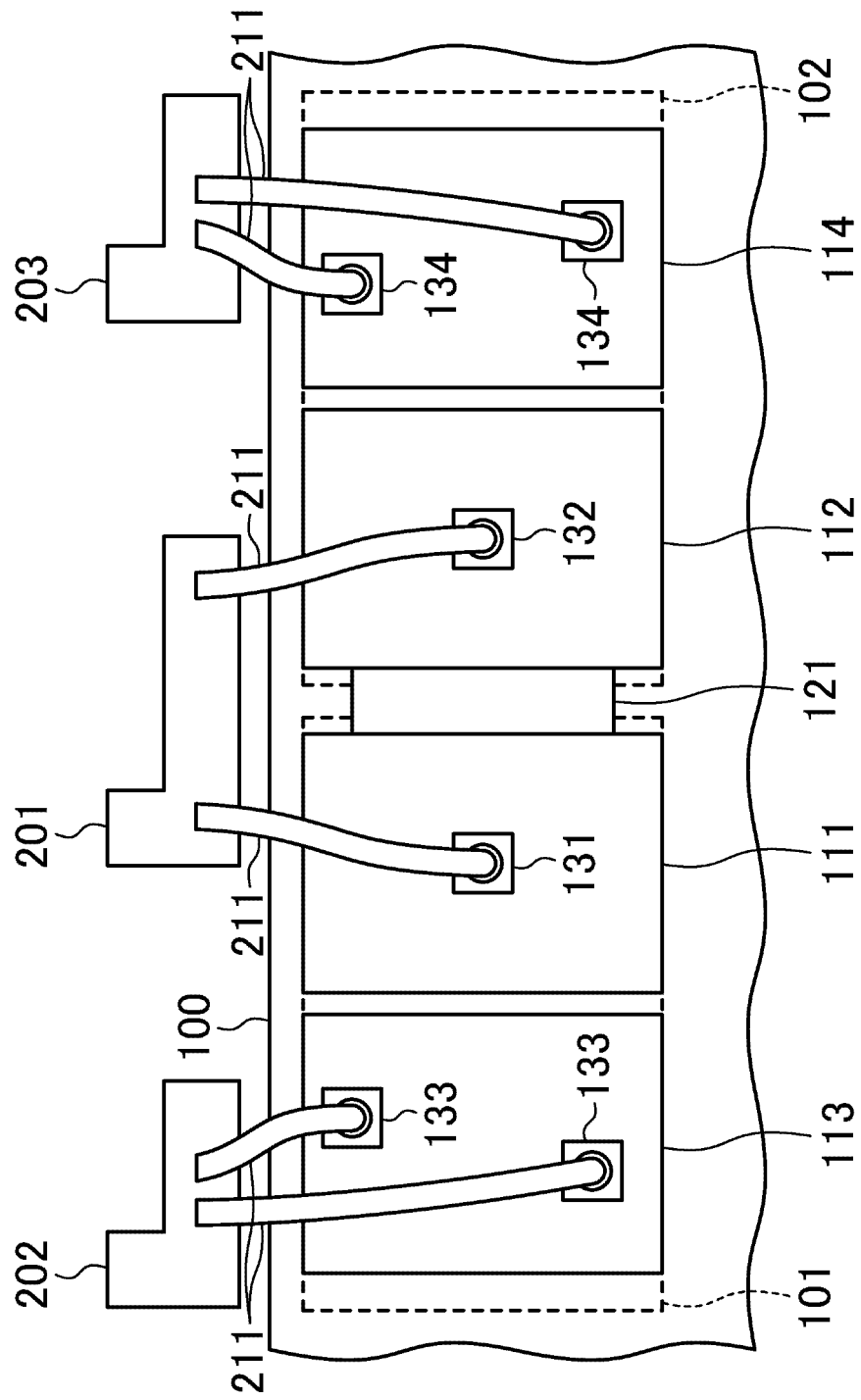
FIG. 5 is a plan view showing another variation of the semiconductor device of the embodiment.

Although one third contact pad 133 is connected to the third bus 113, and one fourth contact pad 134 is connected to the fourth bus 114 in this embodiment, at least a plurality of third contact pads 133 or a plurality of fourth contact pads 134 may be formed. For example, as shown in FIG. 5, two third contact pads 133 and two fourth contact pads 134 may be formed, to allow dispersion of the current in the third bus 113 and the fourth bus 114. Although two third contact pads 133 and two fourth contact pads 134 are formed in FIG. 5, three or more contact pads each may be formed. Also, the number of third contact pads 133 may be different from the number of fourth contact pads 134.

Figure 6:
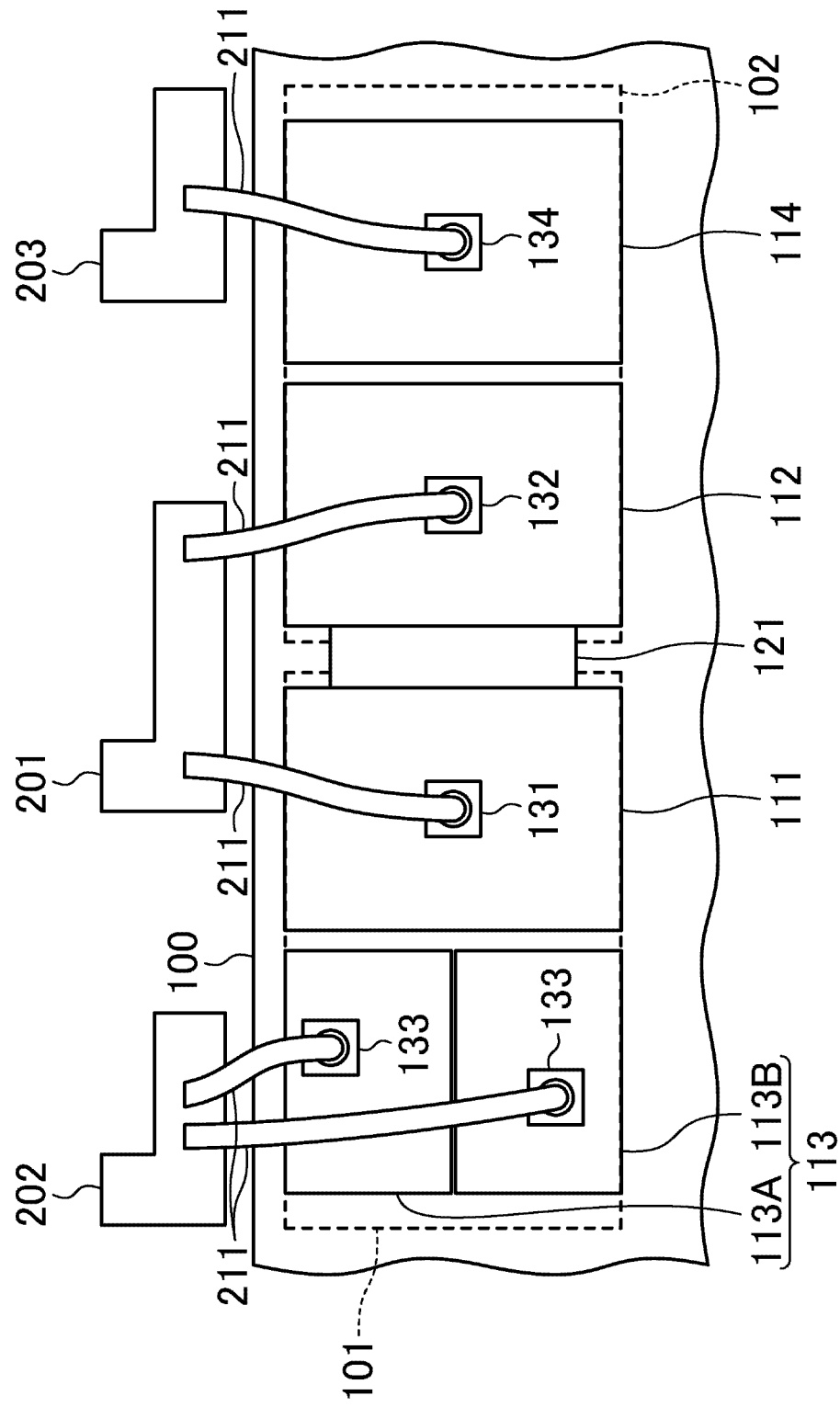
FIG. 6 is a plan view showing yet another variation of the semiconductor device of the embodiment.
Figure 7:
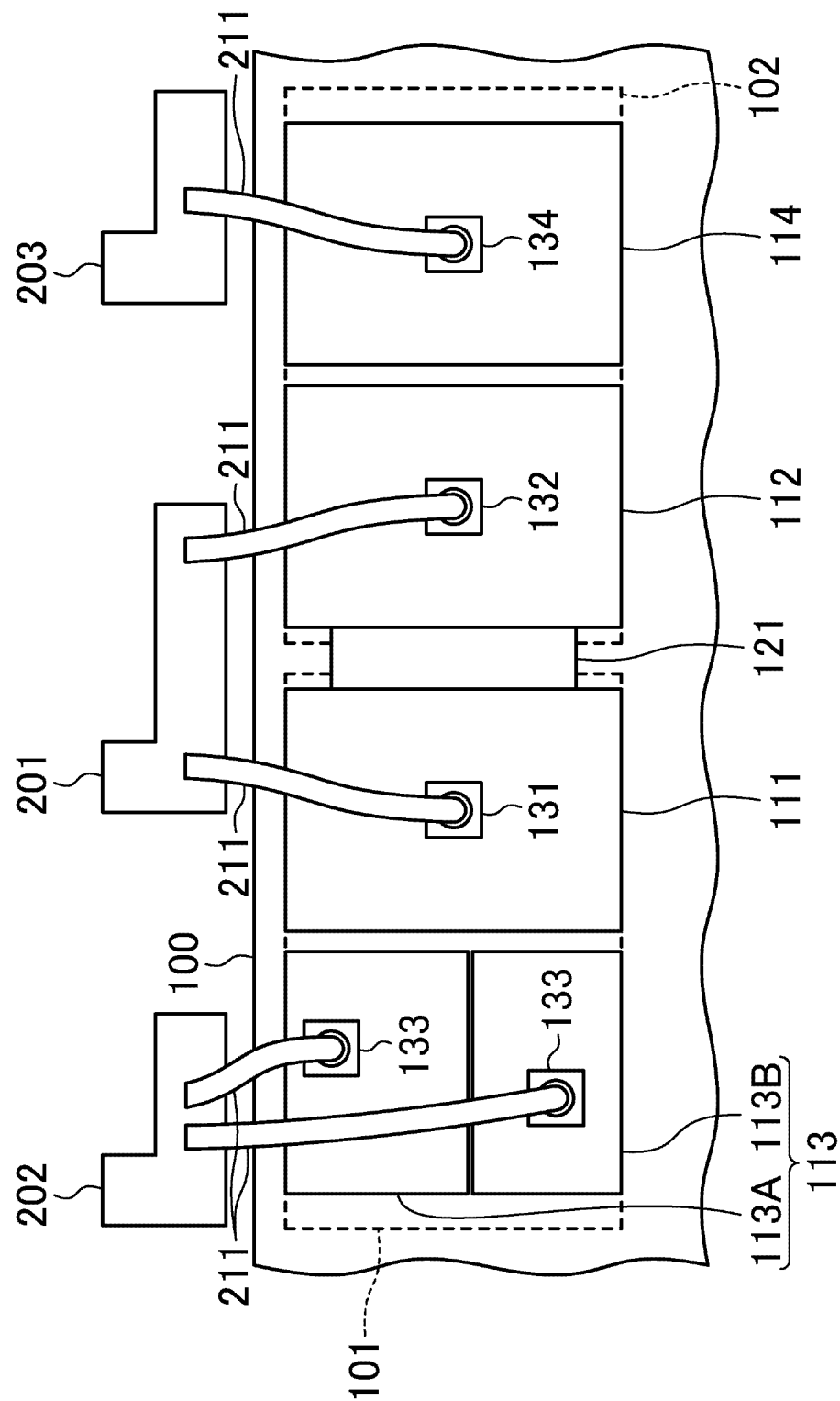
FIG. 7 is a plan view showing yet another variation of the semiconductor device of the embodiment.

At least one of the third bus 113 and the fourth bus 114 may be divided into a plurality of portions. For example, as shown in FIG. 6, the third bus 113 may be divided into a first portion 113A and a second portion 113B, and the third contact pad 133 may be formed on each of the portions. By this division, the current in the third bus 113 can be dispersed. Also, since the size of a metal layer becomes small, mechanical stress applied to the metal layer can be reduced. Although the third bus 113 is divided into two portions in FIG. 6, it may be divided into three or more portions. The sizes of the divided portions may be the same or different. For example, as shown in FIG. 7, the third bus 113 may be divided into two portions so that one closer to the second inner lead 202 and smaller in the length of the wire 211 is larger in size. By this division, the influence of the resistance of the wire 211 can be reduced, permitting more uniform dispersion of the current. The fourth bus 114 can also have a configuration similar to that of the third bus 113.

Figure 8:
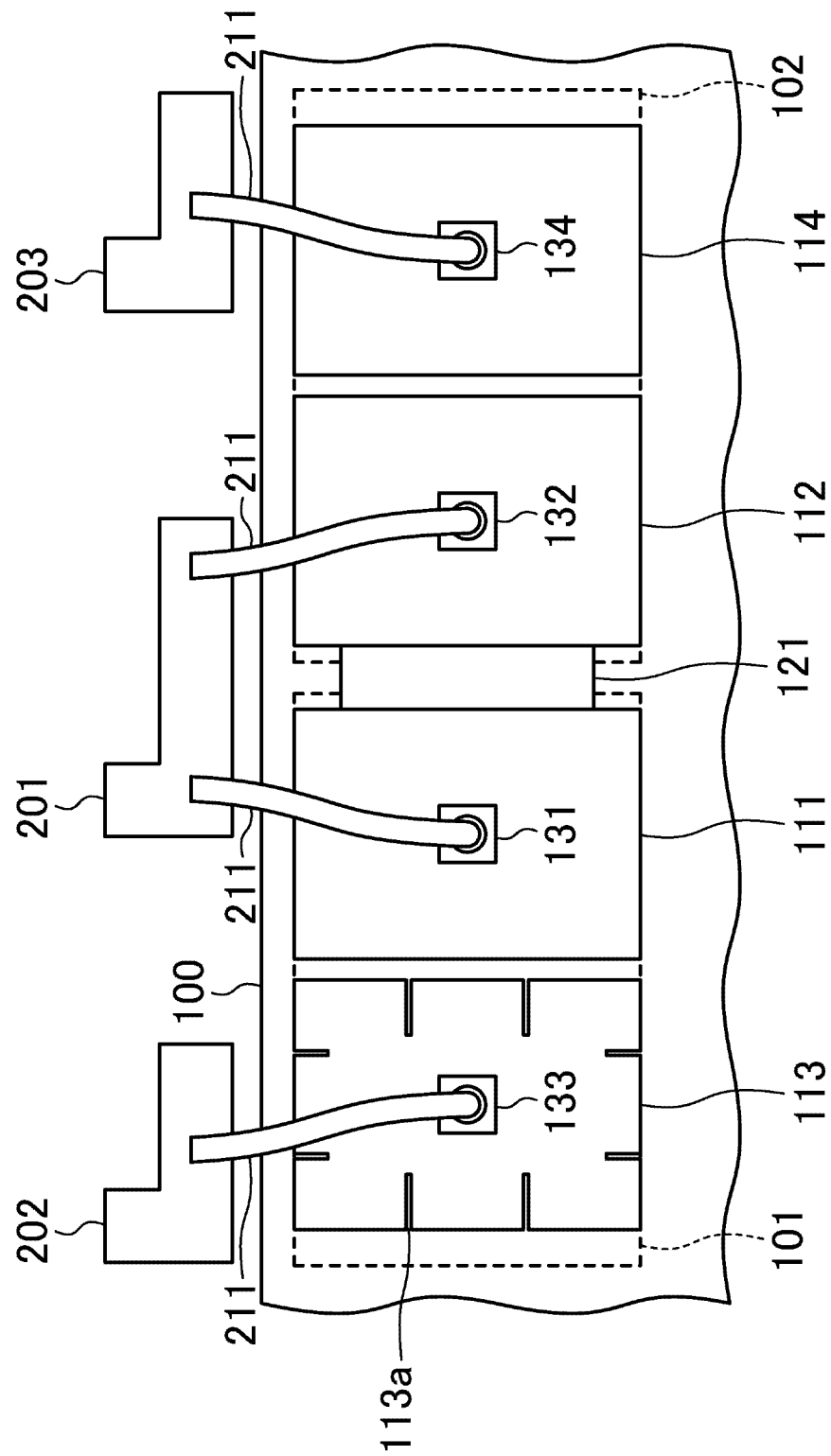
FIG. 8 is a plan view showing yet another variation of the semiconductor device of the embodiment.
Figure 9:
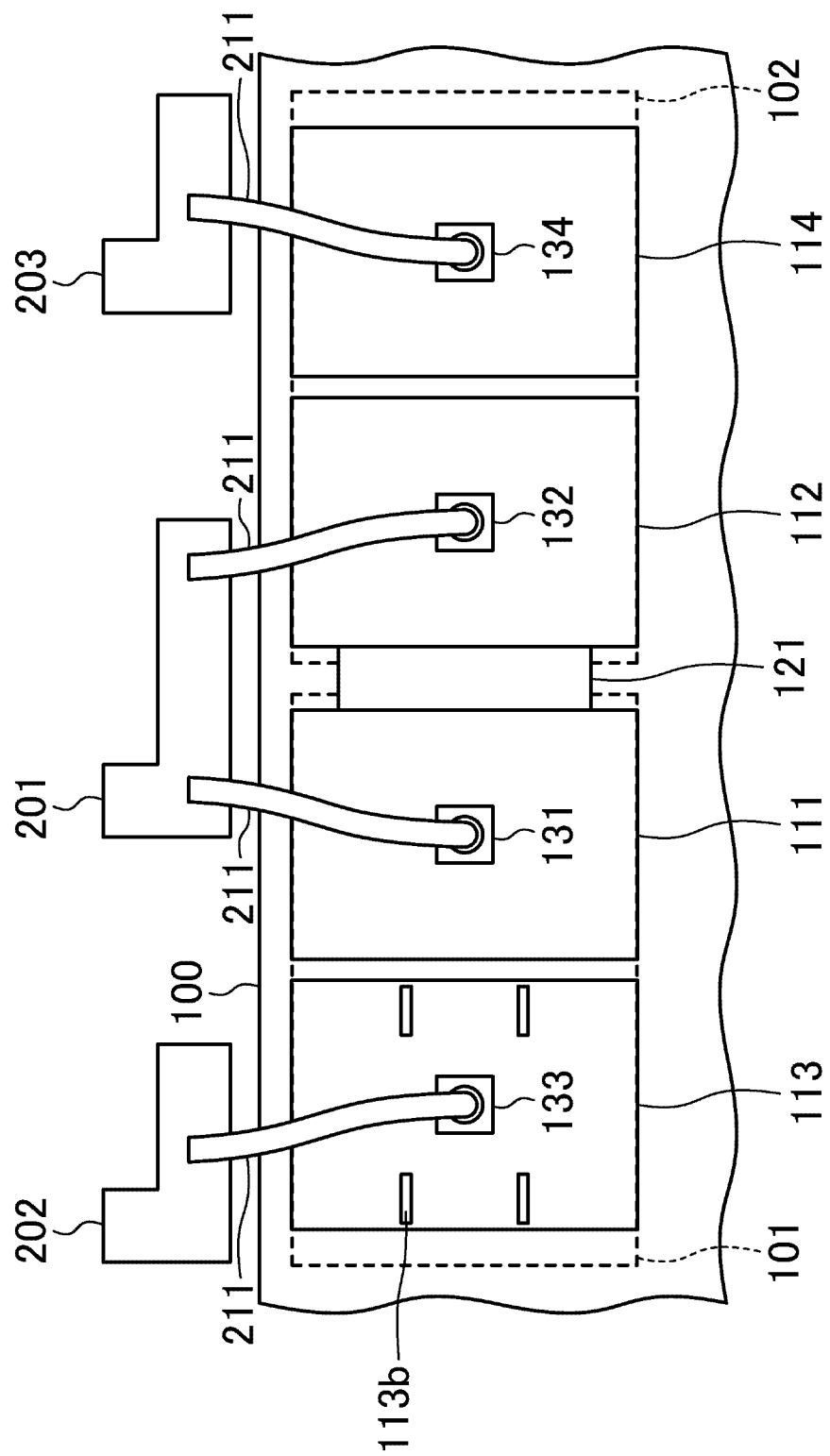
FIG. 9 is a plan view showing yet another variation of the semiconductor device of the embodiment.

At least one of the third bus 113 and the fourth bus 114 may have slits. For example, as shown in FIG. 8, a plurality of slits 113a may be provided at the outer edges of the third bus 113, whereby the current in the third bus 113 can be dispersed. Also, with formation of the slits 113a, mechanical stress applied to the metal layer can be reduced. Although one third contact pad 133 is provided in FIG. 8, a plurality of third contact pads 133 may be provided. Although the slits 113a are formed on all the four sides, it is unnecessary to form slits on all sides. Although the silts 113a are formed at axisymmetric positions, they may be asymmetric. The fourth bus 114 can also have a configuration similar to that of the third bus 113. In place of the slits 113a open at one end, openings 113b may be provided as shown in FIG. 9.

The configurations of the bus interconnects, the third contact pad, the fourth contact pad, the third bus, and the fourth bus may be combined in any way possible.

Although one first contact pad 131 and one second contact pad 132 are formed in the above illustrated examples, it is only necessary that each one or more of them are formed.

The number of first contact pads 131 does not have to be the same as the number of second contact pads 132.

The size of the buses is not particularly limited but may be determined appropriately. In normal power semiconductor devices, the buses generally have an area of about 0.2 mm$^2$.

The material of the buses is not particularly limited, either, but a known metal material such as copper and aluminum may be used. The size of the contact pads is not particularly limited but may be determined appropriately depending on the diameter of the wires used. In general, however, it is about 70 μm square.

Although the portions of the buses exposed through the interlayer insulating film are defined as the contact pads in the above examples, contact pads may be formed on the buses. For example, contact pads made of a metal layer may be formed on the fourth interlayer insulating film 344 to fill the openings in FIG. 2. In this case, the contact pads may be of a multilayer film having a plurality of layers stacked one upon another. In such a multilayer film, a material such as tungsten and titanium easy in joining with the buses may be used for the lowermost layer, a material such as nickel may be used for an intermediate layer so that the stress at bonding can be absorbed, and an alloy of gold and palladium, etc. easy in bonding may be used for the uppermost layer.

This embodiment was described taking, as an example, the configuration of an N-channel transistor and a P-channel transistor complementarily connected to each other. The present disclosure is also applicable to other configurations in a similar way as far as the sources, the drains, or a source and a drain, of two transistors are connected to each other. The two transistors may be the same or different in conductivity type. Also, the two transistors may be connected in series or in parallel.

As described above, the semiconductor device of the present disclosure can achieve a balance between space savings and prevention or reduction of degradation in reliability due to current concentration, and thus is useful as a power semiconductor device, etc., in particular.

What is claimed is:

1. A semiconductor device, comprising:
a first transistor formed on a substrate, having first source/drain regions and second source/drain regions;
a second transistor formed on the substrate, having third source/drain regions and fourth source/drain regions;
an interlayer insulating film formed on the substrate to cover the first transistor and the second transistor;
a first bus in a rectangular shape in plan formed on the interlayer insulating film and connected to the first source/drain regions;
a second bus in a rectangular shape in plan formed on the interlayer insulating film with spacing from the first bus and connected to the third source/drain regions;
an inter-bus interconnect formed between the first bus and the second bus for connecting the first bus with the second bus;
a first contact pad provided on the first bus, to which a first wire is connected; and
a second contact pad provided on the second bus, to which a second wire is connected,
wherein the inter-bus interconnect is in contact with part of a side of the first bus facing the second bus and part of a side of the second bus facing the first bus,
the first contact pad is in contact with part of the first bus, and
the second contact pad is in contact with part of the second bus.

2. The semiconductor device of claim 1, wherein both end portions of the side of the first bus facing the second bus and both end portions of the side of the second bus facing the first bus are not in contact with the inter-bus interconnect.

3. The semiconductor device of claim 1, wherein
the inter-bus interconnect has a plurality of conductors for connecting the first bus with the second bus, and
the conductors are formed with spacing from each other.

4. The semiconductor device of claim 3, wherein an opening separating the conductors from each other is provided on a straight line connecting the first contact pad and the second contact pad.

5. The semiconductor device of claim 1, further comprising:
a third bus formed on the interlayer insulating film and connected to the second source/drain regions; and
a fourth bus formed on the interlayer insulating film and connected to the fourth source/drain regions,
wherein the third bus is formed on a side of the first bus opposite to the side thereof facing the second bus, and
the fourth bus is formed on a side of the second bus opposite to the side thereof facing the first bus.

6. The semiconductor device of claim 5, wherein
the first bus and the third bus are formed right above a region of the substrate where the first transistor is formed, and
the second bus and the fourth bus are formed right above a region of the substrate where the second transistor is formed.

7. The semiconductor device of claim 5, further comprising:
first lower source/drain lines, second lower source/drain lines, first upper source/drain lines, and second upper source/drain lines formed right above the first transistor; and
third lower source/drain lines, fourth lower source/drain lines, third upper source/drain lines, and fourth upper source/drain lines formed right above the second transistor,
wherein the first lower source/drain lines and the second lower source/drain lines are formed alternately in parallel with each other,
the third lower source/drain lines and the fourth lower source/drain lines are formed alternately in parallel with each other,
the first upper source/drain lines and the second upper source/drain lines are formed alternately in parallel with each other between the first and second lower source/drain lines and the first and third buses,
the third upper source/drain lines and the fourth upper source/drain lines are formed alternately in parallel with each other between the third and fourth lower source/drain lines and the second and fourth buses,
the first lower source/drain lines, the second lower source/drain lines, the third lower source/drain lines, and the fourth lower source/drain lines extend in a direction intersecting with the first upper source/drain lines, the second upper source/drain lines, the third upper source/drain lines, and the fourth upper source/drain lines,
the first lower source/drain lines, the second lower source/drain lines, the third lower source/drain lines, and the fourth lower source/drain lines are respectively connected to the first source/drain regions, the second source/drain regions, the third source/drain regions, and the fourth source/drain regions via contacts, and
the first upper source/drain lines, the second upper source/drain lines, the third upper source/drain lines, and the fourth upper source/drain lines are respectively connected to the first lower source/drain lines, the second lower source/drain lines, the third lower source/drain lines, and the fourth lower source/drain lines via first vias, and connected to the first bus, the third bus, the second bus, and the fourth bus via second vias.

* * * * *